United States Patent
Song et al.

(10) Patent No.: US 7,947,973 B2
(45) Date of Patent: May 24, 2011

(54) ORGANIC LIGHT-EMITTING DEVICE

(75) Inventors: Young-Woo Song, Suwon-si (KR);
Jong-Hyuk Lee, Suwon-si (KR);
Won-Jong Kim, Suwon-si (KR);
Yoon-Hyeung Cho, Suwon-si (KR);
Joon-Gu Lee, Suwon-si (KR);
Jae-Heung Ha, Suwon-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 935 days.

(21) Appl. No.: 11/729,840

(22) Filed: Mar. 30, 2007

(65) Prior Publication Data
US 2008/0048558 A1    Feb. 28, 2008

(30) Foreign Application Priority Data
Jul. 14, 2006    (KR) .................... 10-2006-0066269

(51) Int. Cl.
*H01L 29/08* (2006.01)
*H01L 21/00* (2006.01)

(52) U.S. Cl. ........... 257/40; 257/E33.001; 257/E25.008; 257/E51.018; 257/E51.001; 438/82; 438/99; 313/501; 313/506; 428/690; 428/917; 359/238; 359/242

(58) Field of Classification Search .............. 438/82, 438/99; 257/40, E33.001, E25.008, E51.081, 257/E51.001; 313/499–509; 428/690, 917; 359/238, 242
See application file for complete search history.

(56) References Cited

U.S. PATENT DOCUMENTS

| | | | |
|---|---|---|---|
| 4,874,664 A | 10/1989 | Hamaguchi et al. | |
| 6,758,538 B2* | 7/2004 | Fujita et al. | 313/506 |
| 7,176,619 B2 | 2/2007 | Miyachi et al. | |
| 7,255,444 B2 | 8/2007 | Nakashima et al. | |
| 7,379,141 B2 | 5/2008 | Moriya | |
| 7,630,027 B2* | 12/2009 | Koma | 349/69 |
| 2002/0093284 A1 | 7/2002 | Adachi et al. | |
| 2004/0051445 A1 | 3/2004 | Adachi | |
| 2004/0069985 A1 | 4/2004 | Cok | |
| 2004/0201341 A1* | 10/2004 | Miyachi et al. | 313/112 |
| 2005/0088594 A1* | 4/2005 | Mitsui et al. | 349/117 |
| 2006/0262242 A1* | 11/2006 | Koma | 349/69 |
| 2008/0136315 A1* | 6/2008 | Lee et al. | 313/503 |

FOREIGN PATENT DOCUMENTS

| | | |
|---|---|---|
| CN | 1 543 634 A | 11/2004 |
| EP | 1 309 016 A2 | 5/2003 |
| EP | 1 662 589 A2 | 5/2006 |
| JP | 63-132203 A | 6/1988 |
| JP | 09-127885 | 5/1997 |
| JP | 2002-231438 A | 8/2002 |
| JP | 2004-349061 A | 12/2004 |
| JP | 2005-024919 A | 1/2005 |
| JP | 2005-250057 A | 9/2005 |
| JP | 2008-513841 A | 5/2008 |
| KR | 10-2002-0061474 | 7/2002 |
| WO | WO 2006/034051 A2 | 3/2006 |

* cited by examiner

*Primary Examiner* — Hsien-ming Lee
(74) *Attorney, Agent, or Firm* — Lee & Morse, P.C.

(57) ABSTRACT

An organic light-emitting device, including a substrate, an organic light-emitting element on the substrate, a sealing member on the organic light-emitting element, a ¼ wavelength layer on one surface of the substrate, the organic light-emitting element, or the sealing member, and a linear polarization layer on one surface of the substrate, the organic light-emitting element, the sealing member, or the ¼ wavelength layer, the linear polarization layer being closer to an image display surface than the ¼ wavelength layer.

20 Claims, 11 Drawing Sheets

EXTERNAL LIGHT

EXTERNAL LIGHT

ORGANIC LIGHT-EMITTING DEVICE

BACKGROUND OF THE INVENTION

1. Field of the Invention

The present invention relates to an organic light-emitting device. More particularly, the present invention relates to an organic light-emitting device capable of preventing a reduction in contrast due to the reflection of external light.

2. Description of the Related Art

Organic light-emitting devices (OLEDs), which are self-emissive devices, may have higher brightness than liquid crystal displays and may be formed to be thin since no backlight unit is used. However, OLEDs may have reduced contrast due to light reflection when images are viewed in bright environments, e.g., in sunlight.

One way of improving contrast in OLEDs may be to use a circular polarizer. A circular polarizer used in conventional OLEDs may be a film formed by attaching a linear polarization film and a λ/4 retardation film to an image display surface using an adhesive. However, it may be difficult to form a sufficiently thin film-type circular polarizer, since the film-type circular polarizer may include films and an adhesive layer. Moreover, since images are transmitted through all films constituting the circular polarizer, even through an adhesive layer, light transmission efficiency may be decreased and brightness may be reduced.

SUMMARY OF THE INVENTION

It is therefore a feature of an embodiment of the present invention to provide an organic light-emitting device, which substantially overcomes one or more of the problems due to the limitations and disadvantages of the related art.

It is therefore a feature of an embodiment of the present invention to provide an organic light-emitting device that may be thin It is therefore a feature of an embodiment of the present invention to provide an organic light-emitting device that may have better contrast.

It is therefore a feature of an embodiment of the present invention to provide an organic light-emitting device that may have no reduction in brightness.

At least one of the above and other features of the present invention may be realized by providing an organic light-emitting device that may include: a substrate, an organic light-emitting element that may be on the substrate, a sealing member that may be on the organic light-emitting element, a ¼ wavelength layer that may be on one surface of the substrate, the organic light-emitting element, or the sealing member, and a linear polarization layer that may be on one surface of the substrate, the organic light-emitting element, the sealing member, or the ¼ wavelength layer, the linear polarization layer being closer to an image display surface than the ¼ wavelength layer.

The image display surface may be a surface of the substrate. The linear polarization layer may be on the substrate, the ¼ wavelength layer may be on the linear polarization layer, and the organic light-emitting element may be on the ¼ wavelength layer. The ¼ wavelength layer may be on a surface of the substrate, the organic light-emitting element may be on the ¼ wavelength layer, and the linear polarization layer may be on a surface of the substrate opposite to the ¼ wavelength layer. The ¼ wavelength layer may be on an opposite surface of the substrate to the organic light-emitting element, and the linear polarization layer may be on the ¼ wavelength layer. The image display surface may be a surface of the sealing member. The ¼ wavelength layer may be on the organic light-emitting element, and the linear polarization layer may be on the ¼ wavelength layer.

The organic light-emitting device may include a protective layer on the linear polarization layer. The organic light-emitting device may include a protective layer on the organic light-emitting element, the ¼ wavelength layer may be on the protective layer, and the linear polarization layer may be on the ¼ wavelength layer. The organic light-emitting device may include a protective layer on the organic light-emitting element, the ¼ wavelength layer may be on the organic light-emitting element, the protective layer may be on the ¼ wavelength layer, and the linear polarization layer may be on the protective layer. The protective layer may include at least one of an organic insulating material and an inorganic insulating material. The organic light-emitting device may include a reflective layer interposed between the substrate and the organic light-emitting element, the ¼ wavelength layer may be on the reflective layer, the organic light-emitting element may be on the ¼ wavelength layer, and the linear polarization layer may be on the organic light-emitting element.

The sealing member may be a transparent substrate, the ¼ wavelength layer may be on an opposite surface of the sealing member to the organic light-emitting element, and the linear polarization layer may be on the ¼ wavelength layer. The sealing member may be a transparent substrate, the ¼ wavelength layer may be on a surface of the sealing member facing the organic light-emitting element, and the linear polarization layer may be on an opposite surface of the sealing member to the ¼ wavelength layer. The sealing member may be a transparent substrate, the linear polarization layer may be on a surface of the sealing member facing the organic light-emitting element, and the ¼ wavelength layer may be on the linear polarization layer. The organic light emitting element may be a passive matrix organic light-emitting unit.

At least one of the above and other features of the present invention may be realized by providing an organic light-emitting device that may include: a substrate, a thin film transistor that may be on the substrate, an organic light-emitting element that may be on the substrate, the organic light-emitting element being electrically connected to the thin film transistor, a sealing member that may be on the organic light-emitting element, a ¼ wavelength layer that may be on one surface of the substrate, the thin film transistor, the organic light-emitting element, or the sealing member, and a linear polarization layer that may be on one surface of the substrate, the thin film transistor, the organic light-emitting element, the sealing member, or the ¼ wavelength layer, the linear polarization layer being closer to an image display surface than the ¼ wavelength layer.

The linear polarization layer may be on the substrate, the ¼ wavelength layer may be on the linear polarization layer, and the thin film transistor and the organic light-emitting element may be on the ¼ wavelength layer. The linear polarization layer may be on the thin film transistor, and the ¼ wavelength layer may be on the linear polarization layer. The organic light-emitting device may further include a protective layer covering the thin film transistor, the linear polarization layer may be on the protective layer, and the ¼ wavelength layer may be on the linear polarization layer.

The linear polarization layer may be on the substrate, the thin film transistor may be on the linear polarization layer, and the ¼ wavelength layer may be on the thin film transistor. At least one of the linear polarization layer and the ¼ wavelength layer may be interposed between layers constituting the thin film transistor. The linear polarization layer may be on an opposite surface of the substrate to the thin film transistor, and the ¼ wavelength layer may be on the thin film transistor. The ¼ wavelength layer may be on a surface of the substrate, the thin film transistor may be on the ¼ wavelength layer, and the linear polarization layer may be on an opposite surface of the substrate to the ¼ wavelength layer. The organic light emitting device may be a front emission active matrix organic light-emitting device.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
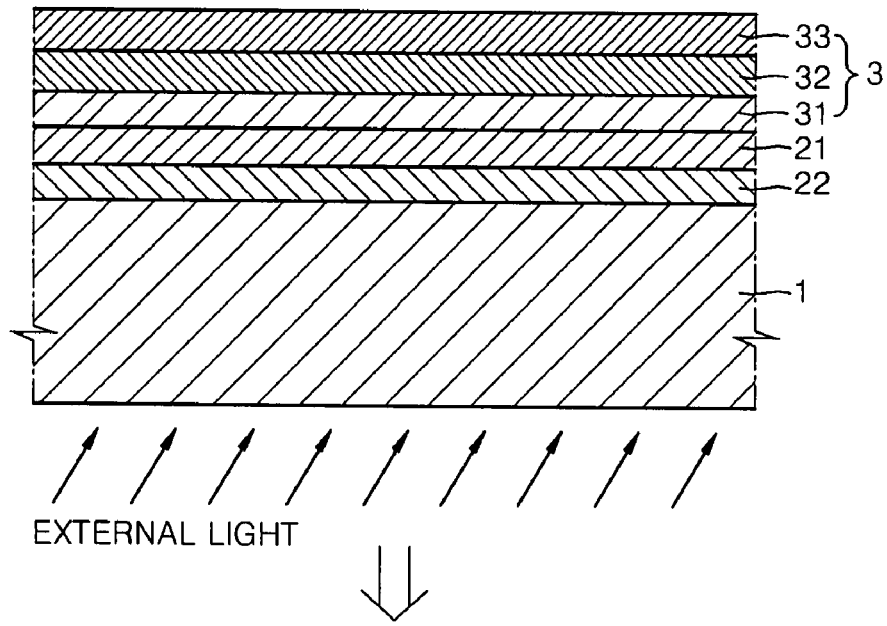
FIG. 1 illustrates a schematic sectional view of a rear emission type organic light-emitting device (OLED) according to an embodiment of the present invention.

Korean Patent Application No. 10-2006-0066269, filed on Jul. 14, 2006, in the Korean Intellectual Property Office, and entitled: "Organic Light-Emitting Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

With the light-emitting devices of the present invention, the following advantages may be obtained.

First, a circular polarization layer may be formed using a film formation process, thereby preventing the reflection of external light, resulting in better contrast.

Second, an adhesive for attaching the circular polarization layer need not be used, thereby decreasing the thickness of a display device and preventing a reduction in brightness.

The present invention will now be described more fully with reference to the accompanying drawings, in which exemplary embodiments of the invention are shown.

FIG. 1 illustrates a schematic sectional view of a rear emission type organic light-emitting device (OLED) according to an embodiment of the present invention.

Referring to FIG. 1, the OLED may include a substrate 1 made of a transparent material, a linear polarization layer 22, a ¼ wavelength layer 21, and an organic light-emitting element 3 that may be sequentially stacked on the substrate 1. Although not shown, a sealing member, e.g., a glass, a thin film member, a metal cap, etc., for sealing the organic light-emitting element 3 may also be on the organic light-emitting element 3.

The substrate 1 may be a transparent glass substrate made of mainly of, e.g., $SiO_2$, borosilicate glass, etc. Although not shown, a buffer layer may be on the substrate 1 in order to increase substrate smoothness and to prevent the infiltration of impurities. The buffer layer may be made of, e.g., $SiO_2$ and/or $SiN_x$, etc. The substrate 1 is not limited to the above-illustrated example. The substrate 1 may also be made of, e.g., a transparent plastic material, etc.

The linear polarization layer 22 may be on the substrate 1, and the ¼ wavelength layer 21 may be on the linear polarization layer 22. The organic light-emitting element 3 may be on the ¼ wavelength layer 21. The linear polarization layer 22 and the ¼ wavelength layer 21 may be stacked so that the linear polarization layer 22 is close to the incidence side of external light, and the ¼ wavelength layer 21 may be on a surface of the linear polarization layer 22 that is opposite to the incidence side of external light. Any light-transmissive layer may be interposed between the linear polarization layer 22 and the ¼ wavelength layer 21.

The organic light-emitting element 3 may include a first electrode layer 31 and a second electrode layer 33, which face each other, and an emission layer 32 may be interposed therebetween.

The first electrode layer 31 may be made of a transparent and conductive material, e.g., indium tin oxide (ITO), indium zinc oxide (IZO), $In_2O_3$, ZnO, etc. The first electrode layer 31 may be patterned using photolithography. In passive matrix (PM) OLEDs, patterns of the first electrode layer 31 may be striped lines spaced apart from each other at predetermined intervals. In active matrix (AM) OLEDs, patterns of the first electrode layer 31 may correspond to pixels. Moreover, in AM-OLEDs, a thin film transistor (TFT) layer including at least one TFT may be on the substrate 1 below the first electrode layer 31, and the first electrode layer 31 may be electrically connected to the TFT layer. PM-OLEDs and AM-OLEDs will be described below in more detail.

The first electrode layer 31 structured as a transparent electrode may serve as an anode when it is connected to an external terminal (not shown). The second electrode layer 33 may be on the first electrode layer 31. The second electrode layer 33 may be a reflective electrode and may be made of at least one of, e.g., aluminum, silver, calcium, etc. The second electrode layer 33 may serve as a cathode when it is connected to a second electrode terminal (not shown).

In PM-OLEDs, the second electrode layer 33 may be striped lines perpendicular to the patterns of the first electrode layer 31. In AM-OLEDs, the second electrode layer 33 may correspond to each pixel. In AM-OLEDs, the second electrode layer 33 may be over the entire surface of an active area in which images are displayed. A detailed description thereof will be provided later.

The polarity of the first electrode layer 31 may be opposite to that of the second electrode layer 33.

The emission layer 32 interposed between the first electrode layer 31 and the second electrode layer 33 may emit light in response to the electrical driving of the first electrode layer 31 and the second electrode layer 33. The emission layer 32 may be made of, e.g., a low molecular weight organic material, a polymeric organic material, etc.

When the emission layer 32 is made of a low molecular weight organic material, a hole transport layer and a hole injection layer may be stacked on a surface of an organic emission layer facing the first electrode layer 31, and an electron transport layer and an electron injection layer may be stacked on a surface of the organic emission layer facing the second electrode layer 33. In addition to a hole injection layer, a hole transport layer, an electron transport layer, an electron injection layer, various other layers may be formed when needed.

The low molecular weight organic materials that may be used herein include, but are not limited to, e.g., copper phthalocyanine (CuPc), N,N'-di(naphthalene-1-yl)-N,N'-diphenyl-benzidine (NPB), tris-8-hydroxyquinoline aluminum (Alq3), etc.

When the emission layer 32 is made of a polymer organic material, only a hole transport layer (HTL) may be on a surface of an organic emission layer facing the first electrode layer 31. The polymer hole transport layer may be deposited on the first electrode layer 31 by, e.g., inkjet printing or spin-coating using poly-(2,4)-ethylene-dihydroxy thiophene (PEDOT), polyaniline (PANI), etc. The polymer organic emission layer may be made of, e.g., poly (phenylene vinylene) (PPV), soluble PPV, cyano-PPV, polyfluorene, etc. The organic emission layer may be formed as color patterns using a conventional method, e.g., inkjet printing, spin coating, laser thermal transfer, etc.

In general rear emission type structures, light emitted from an emission layer of an organic light-emitting element may be directed toward the substrate 1, and a user views images projected downward, i.e., on the bottom side of the substrate 1, as viewed in FIG. 1. In such rear emission type structures, external light (e.g., sunlight) may be incident on the structures through the substrate, thereby reducing contrast.

However, according to the present invention, the linear polarization layer 22 and the ¼ wavelength layer 21 may constitute a circular polarizer, thereby minimizing the reflection of external light.

Among external light incident on the bottom side of the substrate 1, light components corresponding to the absorption axis of the linear polarization layer 22 may be absorbed in the linear polarization layer 22, and light components corresponding to the transmission axis of the linear polarization layer 22 may be transmitted through the linear polarization layer 22. The light components corresponding to the transmission axis of the linear polarization layer 22 may be converted to circularly polarized light components rotating in one direction while they pass through the ¼ wavelength layer 21, and may then be reflected from the second electrode layer 33 of the organic light-emitting element 3. When light components are reflected from the second electrode layer 33, the circularly polarized light components rotating in one direction may be converted to circularly polarized light components rotating in the opposite direction. While the circularly polarized light components again pass through the ¼ wavelength layer 21, the circularly polarized light components rotating in the other direction may be converted to linearly polarized light components which may be perpendicular to the transmission axis of the linear polarization layer 22. Thus, the linearly polarized light components may be absorbed into the linear polarization layer 22 along the absorption axis of the linear polarization layer 22, so that they may not be emitted from the bottom side of the substrate 1. Therefore, the reflection of external light may thus be minimized to result in better contrast.

In addition, since the linear polarization layer 22 and the ¼ wavelength layer 21 may be directly on the substrate 1 with no interposed adhesive, the thickness of the OLED may be reduced compared to that of general OLEDs. Moreover, since there may be no adhesive layer, the occurrence of images or loss of transmittance from light components passing through an adhesive layer, as in general OLEDs, may not occur, thereby resulting in better brightness.

The linear polarization layer 22 and the ¼ wavelength layer 21 may be formed using various film formation methods, e.g., dip coating, spraying, casting, knife coating, wire rod coating, gravure, etc.

Figure 2:
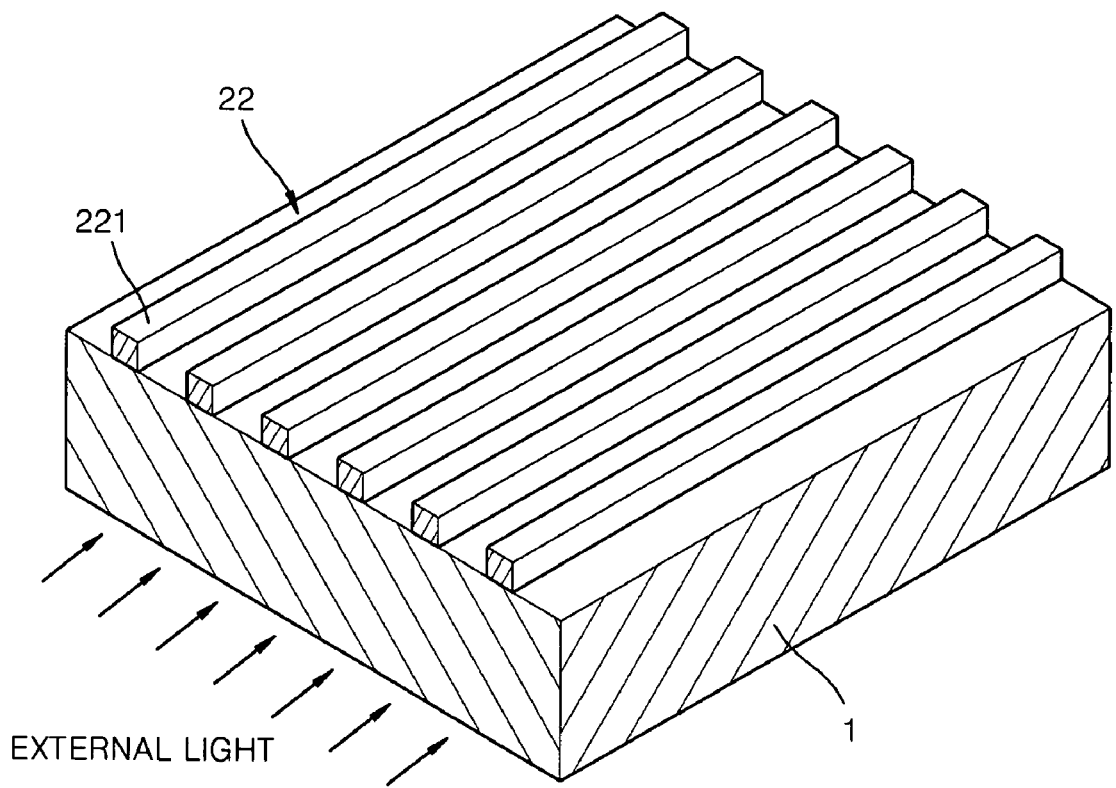
FIG. 2 illustrates a perspective view of a linear polarization layer of the rear emission type OLED of FIG. 1, according to an embodiment of the present invention.

FIG. 2 illustrates linear polarization layer 22 according to an embodiment of the present invention.

Referring to FIG. 2, multiple wire grids 221 may be on the substrate 1 spaced apart from each other at predetermined intervals. The wire grids 221 may have a width of, e.g., about several tens of nm, and a pitch of, e.g., about several tens to several hundreds of nm.

The wire grids 221 may have low reflectivity relative to the incidence direction of external light. Although the reflection of external light may be reduced through circular polarization by a linear polarization layer 22 and a ¼ wavelength layer (see 21 of FIG. 1), light reflection occurring on first planes on which external light may be incident, i.e., on surfaces of the wire grids 221 contacting with the substrate 1 (as viewed in FIG. 2), may not be prevented by circular polarization.

In this regard, in order to reduce reflectivity on the wire grids 221 relative to the incidence direction of external light, the wire grids 221 may be formed by co-deposition of, e.g., graphite and metal, etc. The graphite may be, e.g., normal graphite, etc. CN- or CH-graphite, obtained by adding nitrogen or hydrogen upon deposition, may also be used. The metal may be, e.g., Al, Ag, W, Au, etc.

In order for the wire grids 221 to function as the linear polarization layer 22, the wire grids 221 may be nano-patterned and have high electroconductivity or high k value, where k is the optical absorption factor. The k value of wire grids made of only graphite may be merely 1/10 of the k value of wire grids made of a single metal, e.g., Al, etc. Thus, the wire grids 221 may be made of, e.g., a combination of graphite with metal to optimize the k value, etc. The reflectivity of graphite is about 10-20% of that of aluminum.

The combination of graphite with metal may be achieved by the above-described co-deposition of graphite and metal or by doping a metal on a graphite film. At this time, it may be preferable to adjust the final content of the metal to, e.g., about 5 wt % or less, in order to prevent an increase in reflectivity due to the metal.

The above-described metal-containing graphite film may be nano-patterned using, e.g., a dry etching process, including a photoresist (PR) process, that may be performed using, e.g., a $SiO_2$ or $SiN_x$ hard mask.

Figure 3:
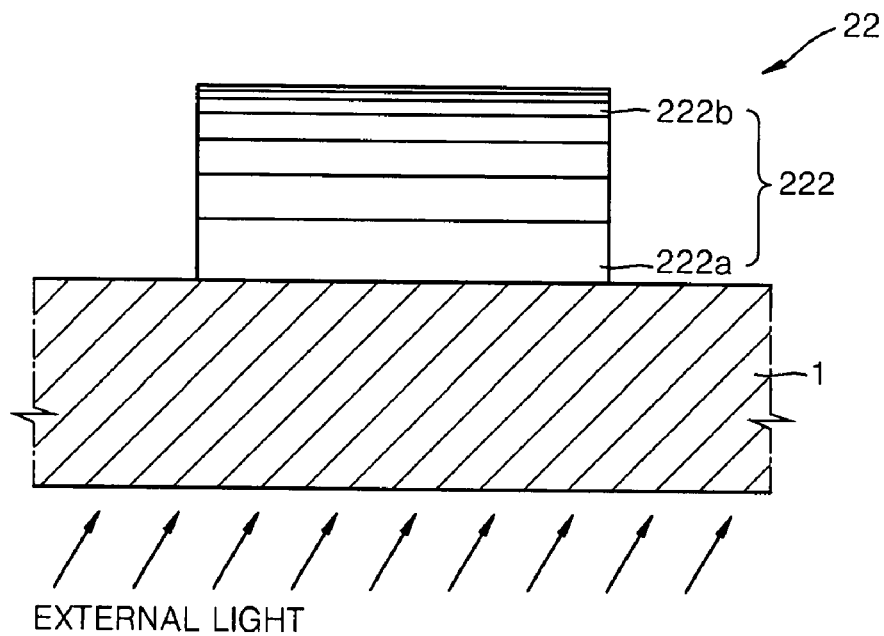
FIG. 3 illustrates a sectional view of the linear polarization layer of the rear emission type OLED of FIG. 1, according to another embodiment of the present invention.

FIG. 3 illustrates the low reflective, linear polarization layer 22 according to another embodiment of the present invention.

Referring to FIG. 3, a wire grid 222 may be composed of a first component 222a which may be, e.g., a transparent material, and a second component 222b which may be, e.g., a metal. The first component 222a and the second component 222b may have a concentration gradient in the thickness direction of the wire grid 222. Here, the content of the first component 222a in the wire grid 222 may increase closer to the substrate 1, and the content of the second component 222b in the wire grid 222 may further from the substrate 1.

Figure 4:
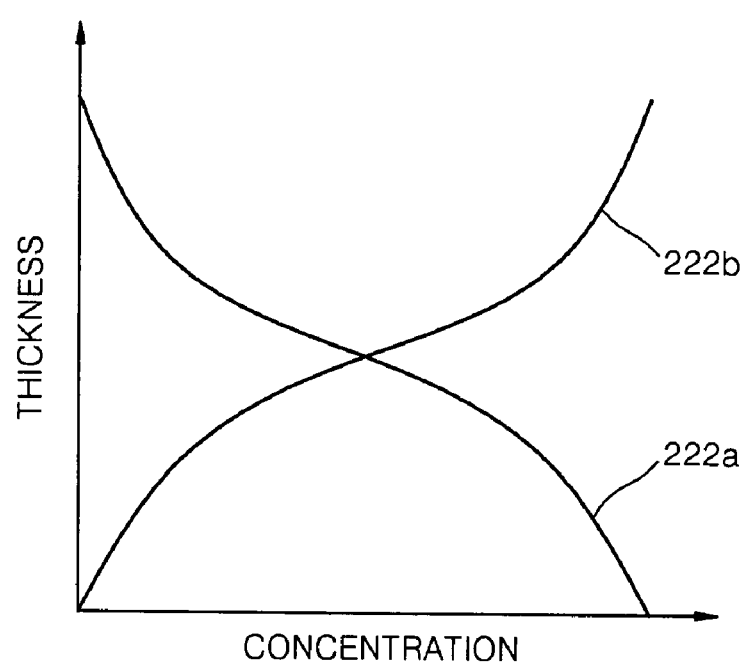
FIG. 4 is a graph of concentrations of first and second components of a wire grid with respect to the thickness of the wire grid in the linear polarization layer of FIG. 3.

That is, as illustrated in FIG. 4, in order to form the wire grid 222 on the substrate 1, the first component 222a and the second component 222b may be deposited so that the concentration gradient of the first component 222a may be opposite to that of the second component 222b. The proportion of the first component 222a relative to the second component 222b may increase as the thickness of the wire grid 222 decreases, and the proportion of the second component 222b relative to the first component 222a may increase as the thickness of the wire grid 222 increases. Thus, the content of the first component 222a may be predominant in a region of the wire grid 222 located nearer to the substrate 1, and the content of the second component 222b may be predominant in a region of the wire grid 222 located farther away from the substrate 1.

The first component 222a may be at least one transparent material selected from transparent insulating materials, e.g., $SiO_x$ ($x \geq 1$), $SiN_x$ ($x \geq 1$), $MgF_2$, $CaF_2$, $Al_2O_3$, $SnO_2$, etc., and transparent conductive materials, e.g., ITO, IZO, ZnO, $In_2O_3$, etc.

The second component 222b may be at least one material selected from, e.g., Fe, Co, V, Ti, Al, Ag, Si, Cr, Mo, Ge, Y, Zn, Zr, W, Ta, Cu, Pt, etc.

As the thickness of the wire grid 222 made of a mixture of a metal and a transparent material having concentration gradients increases, the ratio of the opaque metal to the transparent material may increase, thereby leading to a refractive index difference that may prevent interfacial reflection. Thus, absorption of incident light into the wire grid 222 may be achieved.

Figure 5:
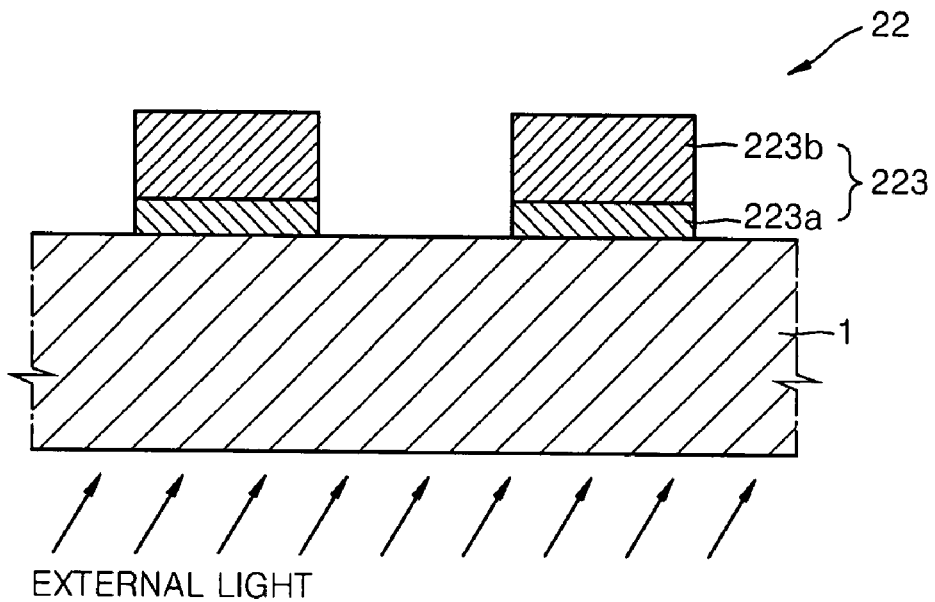
FIGS. 5 and 6 illustrate sectional views of the linear polarization layer of the rear emission type OLED of FIG. 1, according to other embodiments of the present invention.

FIG. 5 illustrates the low reflective, linear polarization layer 22 according to another embodiment of the present invention.

Referring to FIG. 5, a low reflective layer 223a may be disposed close to the incidence side of external light, i.e., adjacent to a substrate 1, and a metal layer 223b may be on the low reflective layer 223a. By doing so, the reflection of incident light on a surface of a wire grid 223, i.e., on a surface of the wire grid 223 adjacent to the substrate 1, may be reduced or prevented. The low reflective layer 223a may be made of, e.g., CdSe, CdTe, Ru, etc.

Figure 6:
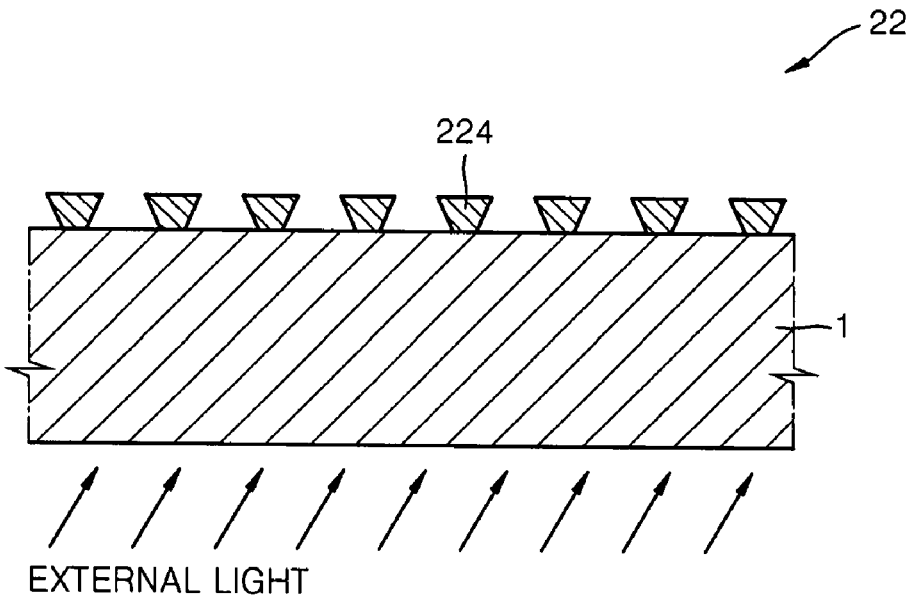

FIG. 6 illustrates the low reflective, linear polarization layer 22 according to another embodiment of the present invention.

Referring to FIG. 6, wire grids 224 having an overhang structure may be on a substrate 1. The wire grids 224 may be made of a metal, e.g., Al, Au, Ag, W, etc. The wire grids 224 may be formed by forming a photoresist (PR) pattern having openings, depositing a metal in the openings, and lifting-off the PR pattern.

The wire grids 224 may be surface-blackened using, e.g., a chemical method, etc. When the wire grids 224 are made of, e.g., aluminum, they may be treated with acid to remove a surface oxide layer and then surface-blackened with a solution of, e.g., about 5 ml of nitric acid, about 25 g of copper nitrate, and about 10 g of potassium permanganate in about 1 L of water. The wire grids 224 may reduce or prevent the reflection of external light.

Figure 7:
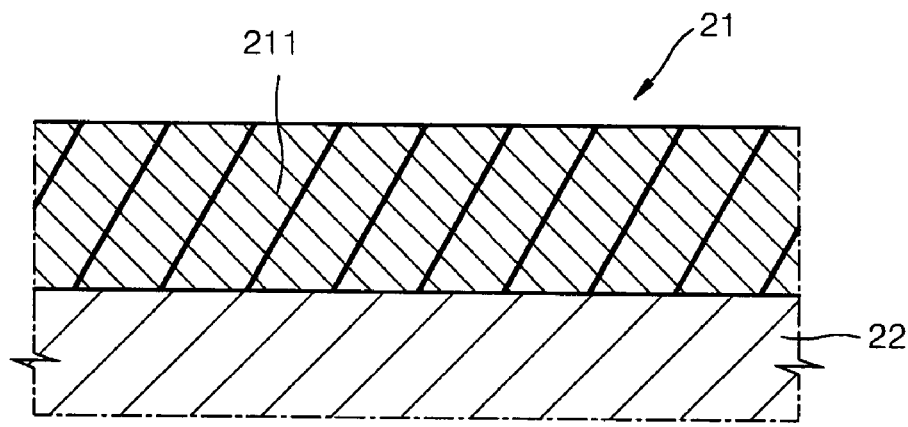
FIG. 7 illustrates a sectional view of a ¼ wavelength layer of the rear emission type OLED of FIG. 1, according to an embodiment of the present invention.

Referring again to FIG. 1, the ¼ wavelength layer 21 may be on the linear polarization layer 22 to prevent reflection of external light, and an embodiment of the ¼ wavelength layer 21 is illustrated in FIG. 7.

Referring to FIG. 7, the ¼ wavelength layer 21 may be formed by oblique deposition using, e.g., an inorganic material. In this case, micro-columns 211 may extend in an oblique direction from a surface of the linear polarization layer 22. The micro-columns 211 may be aligned along the crystal growth direction. When depositing an inorganic material, the inorganic material may grow in a cylindrical shape. Thus, when using oblique deposition, these cylinders may be tilted at a predetermined angle with respect to the horizontal direction of FIG. 7. As a result, the ¼ wavelength layer 21 may be birefringent.

An inorganic material may be used to form the ¼ wavelength layer 21, e.g., $TiO_2$, $TaO_x$, etc. When the ¼ wavelength layer 21 is be made of, e.g., CaO, BaO, etc., the ¼ wavelength layer 21 may have moisture absorption properties, in addition to being birefringent.

The linear polarization layer 22 and the ¼ wavelength layer 21 may also be formed using various other methods. The above-described linear polarization layer 22 and the ¼ wavelength layer 21 may be applied to all the other embodiments of the present invention, as will be described below. The above various embodiments described with reference to FIGS. 2 through 7 are based on rear emission type OLEDs, as illustrated in FIG. 1, but may be applied to front emission type OLEDs after being modified to consider the incidence of external light.

Figure 8:
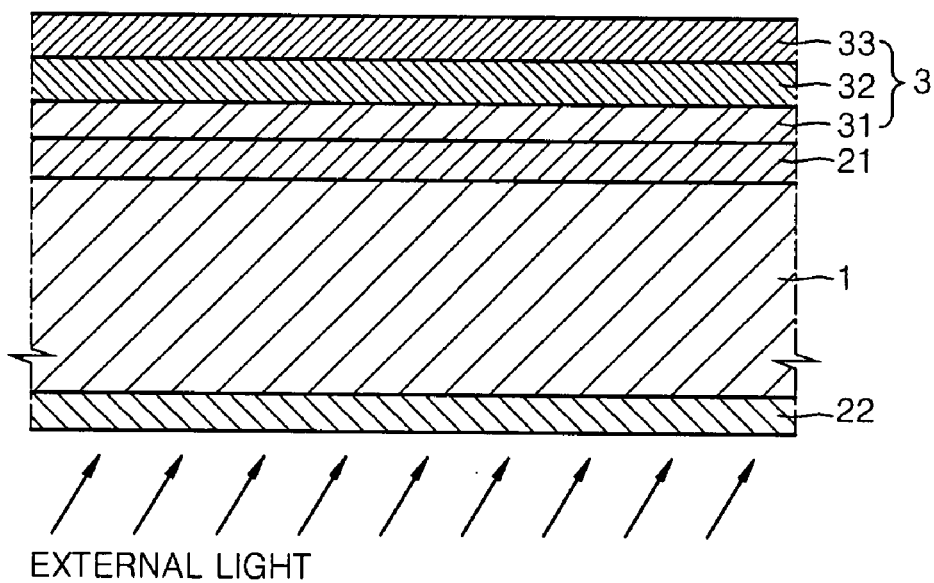
FIGS. 8 and 9 illustrates schematic sectional views of rear emission type OLEDs according to other embodiments of the present invention.

FIG. 8 illustrates a sectional view of a rear emission type OLED according to another embodiment of the present invention. Referring to FIG. 8, the linear polarization layer 22 may be on a surface of the substrate 1 facing the outside, and the ¼ wavelength layer 21 may be on the other surface of the substrate 1. The organic light-emitting element 3 may be on the ¼ wavelength layer 21. These constitutional elements are similar to those described above. According to this embodiment of the present invention, external light incident on the substrate 1 may be converted to linearly polarized light which may be parallel to the transmission axis of the linear polarization layer 22 while it passes through the linear polarization layer 22. The linearly polarized light may then be transmitted through the substrate 1 and may then converted to circularly polarized light rotating in one direction while it passes through the ¼ wavelength layer 21. The circularly polarized light rotating in one direction may be reflected from the second electrode layer 33 and then converted to circularly polarized light rotating in the other direction. While the light again passes through the ¼ wavelength layer 21, the circularly polarized light rotating in the other direction may be converted to linearly polarized light which may be perpendicular to the transmission axis of the linear polarization layer 22. The linearly polarized light thus may not pass through the linear polarization layer 22, and the external light reflected may not be found outside a bottom side of the substrate 1.

Figure 9:
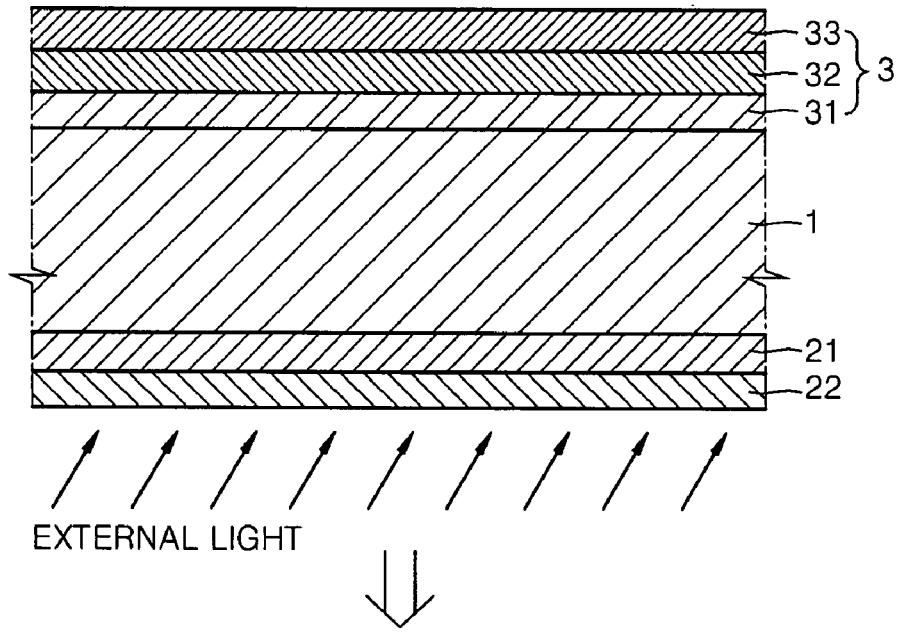

FIG. 9 illustrates a sectional view of a rear emission type OLED according to another embodiment of the present invention. Referring to FIG. 9, a ¼ wavelength layer 21 and a linear polarization layer 22 may be sequentially on a surface of a substrate 1 facing the outside, and an organic light-emitting element 3 may be on the other surface of the substrate 1. These constitutional elements are similar to those described above. According to the current embodiment of the present invention, the reflection of external light may be prevented, thereby improving contrast.

According to the above-described embodiments of the present invention, it may be possible to alleviate the disadvantage of general OLED structures that suffer from a thickness increase due to attachment of a separate polarization film using an adhesive.

The above embodiments of the present invention have been described in terms of rear emission type OLEDs displaying images in the direction of a substrate, but the present invention is not limited thereto. The present invention may also be applied to front emission type OLEDs displaying images coming from an emission layer in the opposite direction to the substrate.

Figure 10:
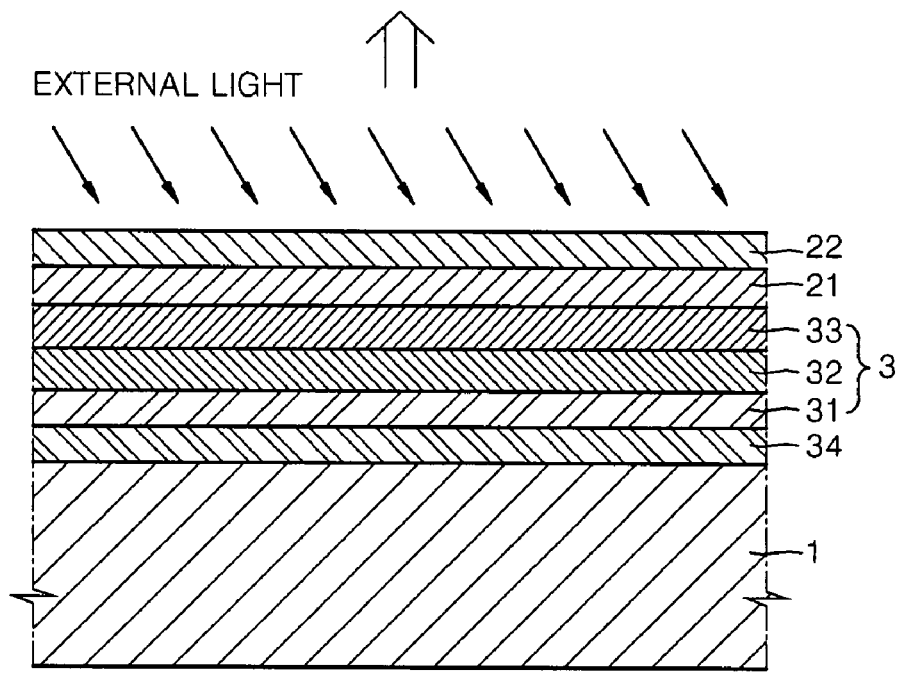
FIGS. 10 through 16 illustrate schematic sectional views of front emission type OLEDs according to some embodiments of the present invention.

FIG. 10 illustrates a sectional view of a front emission type OLED according to an embodiment of the present invention. Referring to FIG. 10, a reflective layer 34 may be on the substrate 1, and the organic light-emitting element 3 may be on the reflective layer 34. A sealing member (not shown) for sealing the organic light-emitting element 3 may be on the organic light-emitting element 3.

The substrate 1 may be a transparent glass substrate as described above, but the substrate 1 may not necessarily be transparent. The substrate 1 may be made of, e.g., a plastic material, a metal material, etc., in addition to glass. When the substrate 1 is made of a metal, an insulating film may be on a surface of the metal.

The reflective layer 34 on a surface of the substrate 1 may be made of, e.g., Ag, Mg, Al, Pt, Pd, Au, Ni, Nd, Ir, Cr, a compound thereof, etc. The first electrode layer 31 may be on the reflective layer 34, and the first electrode layer 34 may be a material with a high work function, e.g., ITO, IZO, ZnO, $In_2O_3$, etc. In this case, the first electrode layer 31 serves as an anode. If the first electrode layer 31 is used as a cathode, the first electrode layer 31 may be made of, e.g., Ag, Mg, Al, Pt, Pd, Au, Ni, Nd, Ir, Cr, a compound thereof, etc. The first electrode layer 31 may also serve as a reflective layer. Hereinafter, the present invention will be described in terms of the utilization of the first electrode layer 31 as an anode.

The second electrode layer 33 may be formed as a transmissive electrode. Thus, the second electrode layer 33 may be formed as a translucent thin film from a metal or alloy with a low work function, e.g., Li, Ca, LiF/Ca, LiF/Al, Al, Mg, Ag, etc. When a transparent and conductive structure made of, e.g., ITO, IZO, ZnO, $In_2O_3$ is on such a metal translucent film, high resistance problems due to the thinness of the translucent film may be overcome.

The emission layer 32 may be interposed between the first electrode layer 31 and the second electrode layer 33 and may be as described above.

In an embodiment of the present invention, a ¼ wavelength layer 21 and a linear polarization layer 22 may sequentially be on the second electrode layer 33.

External light incident on an image display surface, i.e., external light coming from an upper side (as viewed in FIG. 10), may pass through the linear polarization layer 22 and the ¼ wavelength layer 21 in sequence. The incident light, after being reflected from each layer of the organic light-emitting element 3 or the reflective layer 34, may not pass through the ¼ wavelength layer 21. The principle may be as described above, and thus, a detailed description thereof will be omitted.

Figure 11:
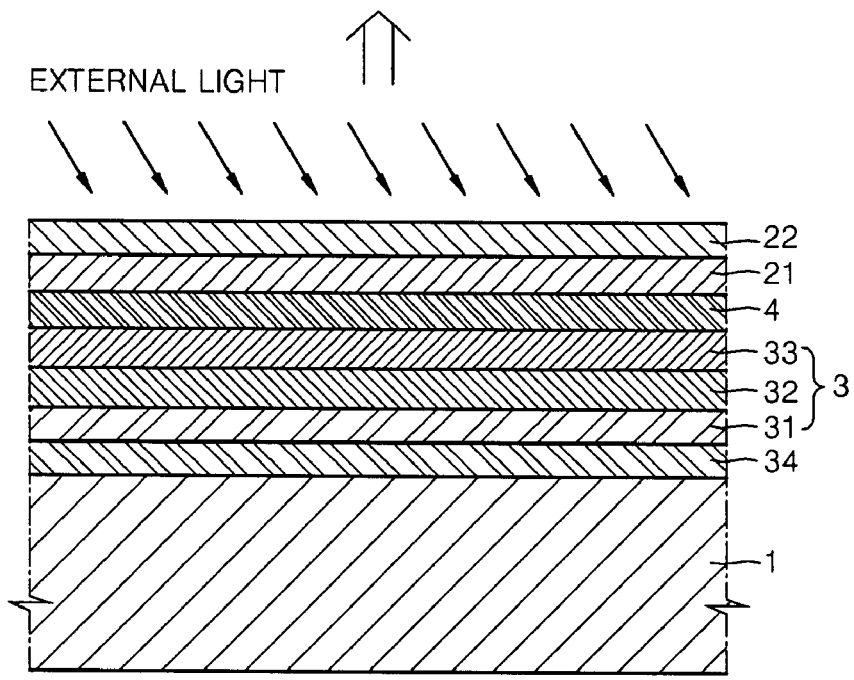

When the ¼ wavelength layer 21 and the linear polarization layer 22 are on the second electrode layer 33, a protective layer 4 may be on the second electrode layer 33, and the ¼ wavelength layer 21 and the linear polarization layer 22 may be on the protective layer 4, as illustrated in FIG. 11. The protective layer 4 may serve to prevent damage to the second electrode layer 33 during the formation of the ¼ wavelength layer 21, and the protective layer 4 may be made of, e.g., a transparent inorganic material, a transparent organic material, etc.

Examples of the inorganic material may include, e.g., metal oxide, metal nitride, metal carbide, metal oxynitride, combinations of these materials, etc. The metal oxide may be, e.g., silicon oxide, aluminum oxide, titanium oxide, indium oxide, tin oxide, indium tin oxide, combinations of these materials, etc. The metal nitride may be, e.g., aluminum nitride, silicon nitride, combinations of these materials, etc. The metal carbide may be, e.g., silicon carbide, etc., and the metal oxynitride may be, e.g., silicon oxynitride, etc. The inorganic material may also be, e.g., silicon, a ceramic derivative of silicon, a ceramic derivative of metal, etc. In addition, the inorganic material may be, e.g., diamond-like carbon (DLC), etc.

Examples of the organic material include, e.g., organic polymers, inorganic polymers, organometallic polymers, hybrid organic/inorganic polymers, etc. An organic resin, e.g., acrylic resin, methacrylic resin, etc., may also be used.

Although not shown, the protective layer 4 may also be between the ¼ wavelength layer 21 and the linear polarization layer 22, or alternatively, may also be on the linear polarization layer 22.

Figure 12:
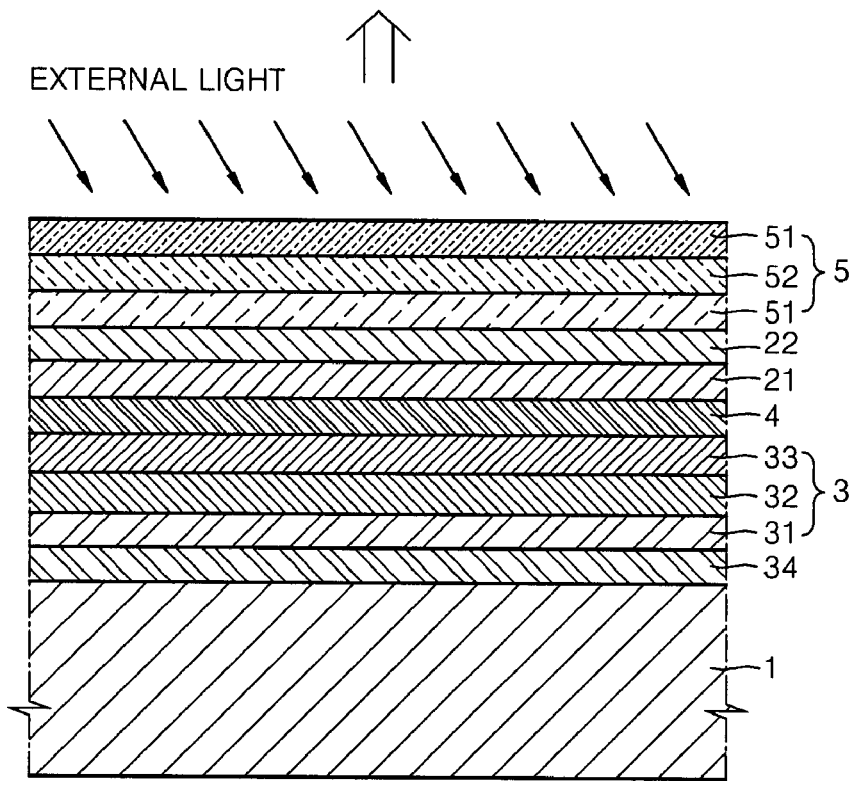

FIG. 12 illustrates a front emission type OLED according to another embodiment of the present invention. The front emission type OLED illustrated in FIG. 12 may be the similar to that illustrated in FIG. 11, except that a thin film type sealing member 5 may be on the linear polarization layer 22.

The thin film type sealing member 5 may serve to protect an organic light-emitting element 3 from, e.g., external moisture, oxygen, etc., and may include at least one inorganic material layer 51 and at least one organic material layer 52. The inorganic material layer 51 and the organic material layer 52 may be alternately stacked. The other constitutional elements may be as described above, and a detailed description thereof will thus be omitted.

The inorganic material layer 51 may be made of, e.g., metal oxide, metal nitride, metal carbide, metal oxynitride, combinations of these materials, etc. The metal oxide may be, e.g., silicon oxide, aluminum oxide, titanium oxide, indium oxide, tin oxide, ITO, IZO, combinations of these materials, etc. The metal nitride may be, e.g., aluminum nitride, silicon nitride, combinations of these materials, etc. The metal carbide may be, e.g., silicon carbide, etc., and the metal oxynitride may be, e.g., silicon oxynitride, etc. The inorganic material may also be, e.g., silicon, a ceramic derivative of silicon, a ceramic derivative of metal, etc. In addition, the inorganic material may be, e.g., DLC, etc.

The inorganic material layer 51 may be formed by, e.g., a deposition process, etc. In this case, there may be disadvantageous pore growth in the inorganic material layer 51. In order to prevent the continuous growth of pores in the same positions, the organic material layer 52 may be deposited. The organic material layer 52 may not be restricted to purely organic materials if a polymer is present, and the organic material layer 52 may be made of, e.g., an organic polymer, an inorganic polymer, an organometallic polymer, a hybrid organic/inorganic polymer, etc. Preferably, an organic resin, e.g., acrylic resin, methacrylic resin, etc., may be used.

FIG. 12 illustrates that the inorganic material layer 51, the organic material layer 52, and an additional inorganic material layer 53 may be sequentially stacked on the linear polarization layer 22, but the present invention is not limited to this configuration. Alternately, an inorganic material layer may be sandwiched between two organic material layers to form the thin film type sealing member 5. Multiple organic material layers and multiple inorganic material layers may also be stacked. The thin film type sealing member 5 is not limited to the embodiment illustrated in FIG. 12, and may also be applied to all the other embodiments of the present invention.

Figure 13:
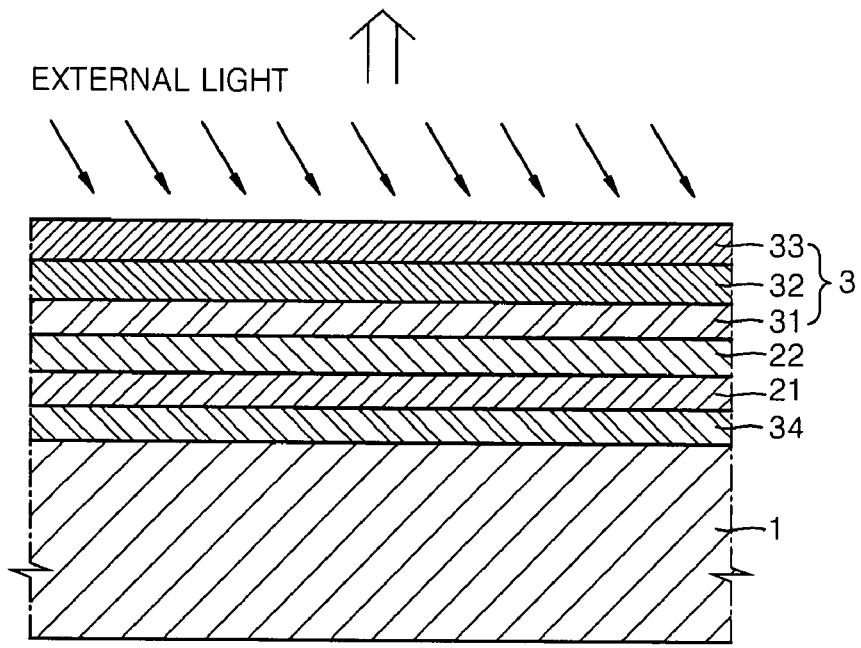

FIG. 13 illustrates a front emission type OLED according to another embodiment of the present invention. Referring to FIG. 13, the ¼ wavelength layer 21 and the linear polarization layer 22 may be between the reflective layer 34 and the organic light-emitting element 3. As described above, external light incident on the front emission type OLED in the arrow direction may be converted to linearly polarized light which may be parallel to the transmission axis of the linear polarization layer 22 while it passes through the linear polarization layer 22. The linearly polarized light may be converted to circularly polarized light rotating in one direction while it passes through the ¼ wavelength layer 21. The circularly polarized light rotating in one direction may be reflected from the reflective layer 34 and then converted to circularly polarized light rotating in the other direction. While the light again passes through the ¼ wavelength layer 21, the circularly polarized light rotating in the other direction may be converted to linearly polarized light which may be perpendicular to the transmission axis of the linear polarization layer 22. The linearly polarized light may not pass through the linear polarization layer 22, and thus, the external light reflected cannot be found outside the image display surface.

Although not shown, the ¼ wavelength layer 21, the organic light-emitting element 3, and the linear polarization layer 22 may also sequentially be on the reflective layer 34.

Figure 14:
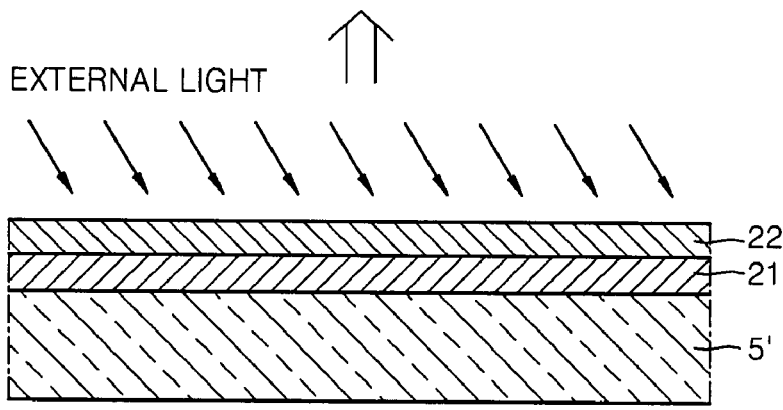
Figure 14:
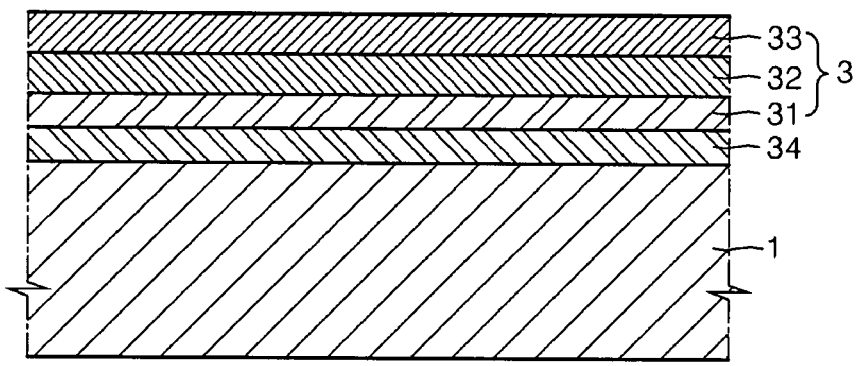

FIG. 14 illustrates a front emission type OLED in which a transparent substrate 5' may be used as a sealing member, according to another embodiment of the present invention.

In the current embodiment of the present invention, the transparent substrate material may be, e.g., glass, plastic, etc.

Referring to FIG. 14, the ¼ wavelength layer 21 and the linear polarization layer 22 may be sequentially on an upper surface of the transparent substrate 5', i.e., on a surface of the transparent substrate 5' facing the outside.

Figure 15:
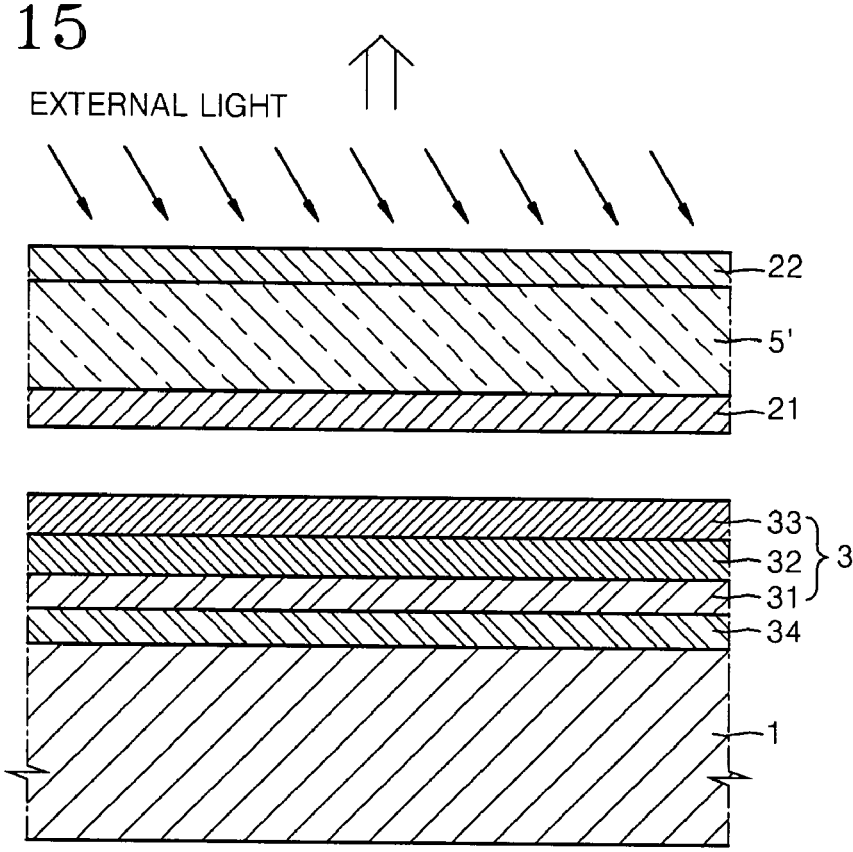
Figure 16:
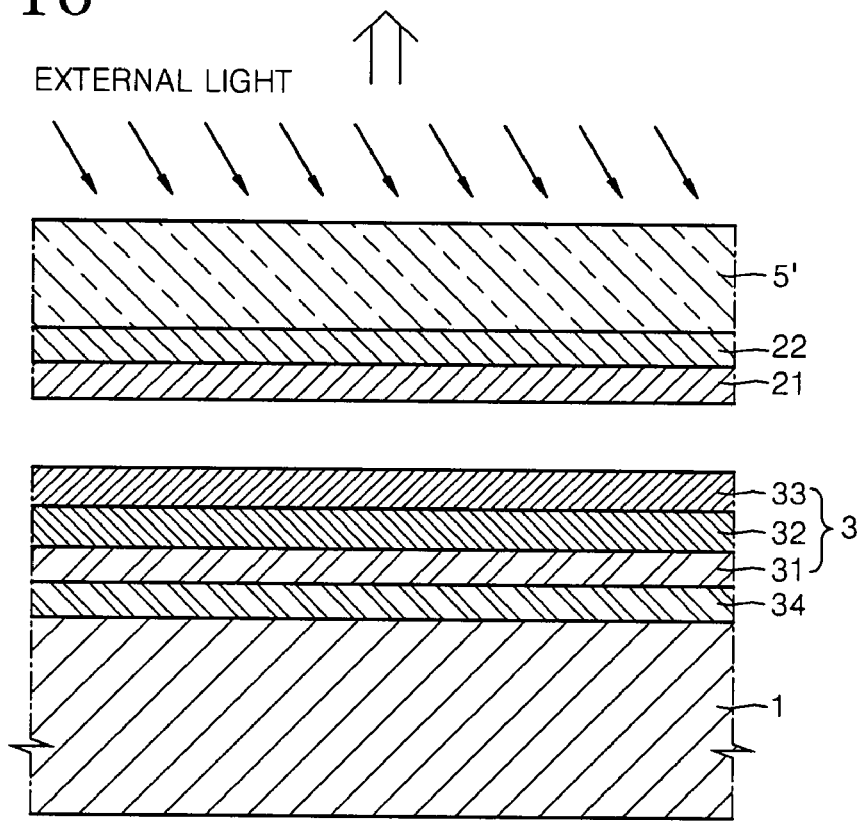

FIG. 15 illustrates a front emission type OLED according to another embodiment of the present invention. In FIG. 15, the ¼ wavelength layer 21 may be on a surface of the transparent substrate 5' facing the organic light-emitting element 3. The linear polarization layer 22 may be on the other surface of the transparent substrate 5'. FIG. 16 illustrates that the linear polarization layer 22 and the ¼ wavelength layer 21 may be sequentially on a surface of the transparent substrate 5' facing the organic light-emitting element 3.

According to the front emission type OLEDs of the above-described embodiments of the present invention, a linear polarization layer may be disposed to face external light, and a ¼ wavelength layer may be on a side of the linear polarization layer opposite to the external light. Thus, the reflection of external light may be prevented according to the same principles as described above.

In the embodiments illustrated in FIGS. 14 through 16, although not shown, an inert gas, e.g., nitrogen, argon, etc., may be filled between the transparent substrate 5' and the organic light-emitting element 3, and an organic or inorganic material may be further deposited to improve the sealing characteristics of the organic light-emitting element 3.

Figure 17:
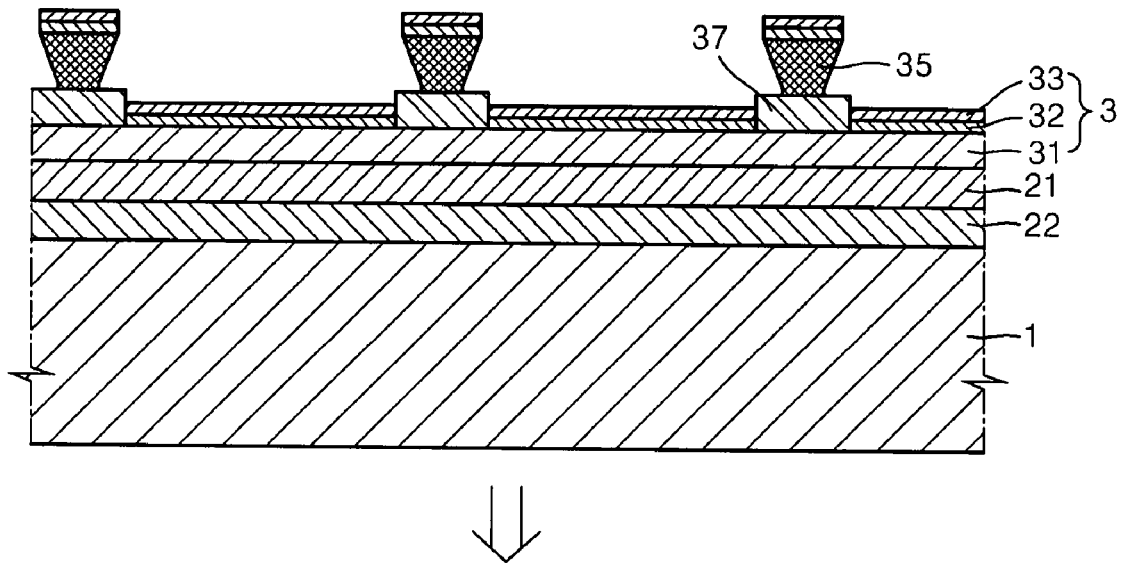
FIG. 17 illustrates a sectional view of a rear emission type, passive matrix (PM) OLED according to an embodiment of the present invention.

FIG. 17 illustrates a rear emission type PM-OLED according to an embodiment of the present invention.

Referring to FIG. 17, and as illustrated in FIG. 1, the linear polarization layer 22 and the ¼ wavelength layer 21 may be sequentially on the substrate 1, and the organic light-emitting element 3 may be on the ¼ wavelength layer 21.

The first electrode layer 31 may be formed in a stripe pattern on the ¼ wavelength layer 21, and an internal insulating film 37 may be on the first electrode layer 31 to partition the first electrode layer 31. A separator 35 perpendicular to the first electrode layer 31 may be on the internal insulating film 37 to pattern the emission layer 32 and the second electrode layer 33. The emission layer 32 and the second electrode layer 33 may be patterned by the separator 35 so that they intersect with the first electrode layer 31. A sealing member (not shown) may be on the second electrode layer 33 to protect the organic light-emitting element 3 from ambient air. In some cases, the emission layer 32 and the second electrode layer 33 may also be patterned with no separator.

In the configuration illustrated in FIG. 17, similar to that illustrated in FIG. 1, external light incident on a bottom side of a substrate may not be reflected, thereby improving contrast, and the entire thickness of a display device may be decreased.

Although not shown, the structures illustrated in FIGS. 8 and 9 may also be applied to the PM-OLED illustrated in FIG. 17.

Figure 18:
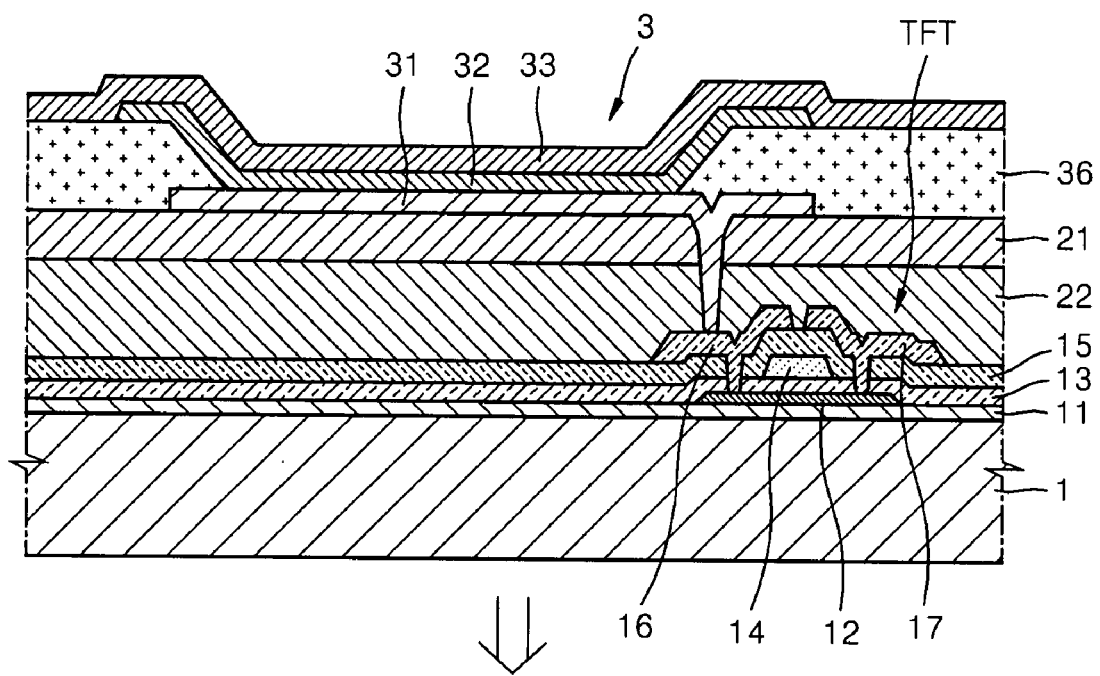
FIG. 18 illustrates a sectional view of a rear emission type, active matrix (AM) OLED according to an embodiment of the present invention.

FIG. 18 illustrates a rear emission type AM-OLED according to an embodiment of the present invention.

Referring to FIG. 18, a thin film transistor (TFT) may be on an upper surface of the substrate 1. Each pixel may include at least one TFT. The TFT may be electrically connected to the organic light-emitting element 3.

The TFT may include a buffer layer 11 on the substrate 1, and a semiconductor active layer 12 may be formed in a predetermined pattern on the buffer layer 11. A gate insulating film 13 made of, e.g., $SiO_2$, $SiN_x$, etc., may be on the semiconductor active layer 12, and a gate electrode 14 may be on a portion of the gate insulating film 13. The gate electrode 14 may be connected to a gate line (not shown) that may apply a TFT ON/OFF signal. An inter-insulating layer 15 may be on the gate electrode 14, and a source/drain electrode 16 may be contacted to a source/drain region of the semiconductor active layer 12 through a contact hole. An additional source/drain electrode 17 may complete the TFT. In the present invention, electrode 17 may function as the source electrode and electrode 16 may function as the drain electrode. Alternately, electrode 17 may function as the drain electrode and electrode 16 may function as the source electrode.

The TFT may be covered and protected with a passivation layer. According to the embodiment illustrated in FIG. 18, the passivation layer may be structured as, e.g., the linear polarization layer 22 and the ¼ wavelength layer 21 that are sequentially stacked.

The first electrode layer 31, which may be used as an anode, may be on the ¼ wavelength layer 21 and may be covered with a pixel define layer 36 made of an insulating material. An opening may be formed in the pixel define layer 36, and the emission layer 32 may be formed in a region defined by the opening. The second electrode layer 33 may be on the emission layer 32 so that all pixels may be covered with the second electrode layer 33.

In the above-described AM-type structure, the linear polarization layer 22 and the ¼ wavelength layer 21 which are sequentially on the TFT may prevent the reflection of external light incident on the bottom side of the substrate 1 (as viewed in FIG. 18).

Figure 19:
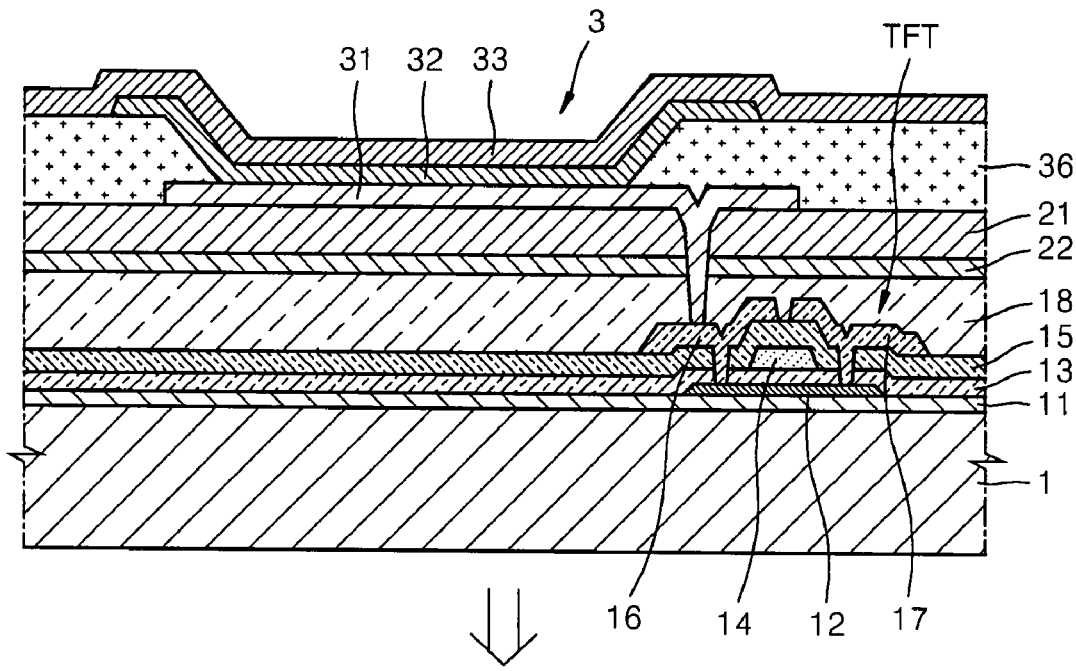
FIG. 19 illustrates a sectional view of a rear emission type AM-OLED according to another embodiment of the present invention.

Referring to FIG. 19, a passivation layer 18 may be separately on a TFT using an organic material and/or an inorganic material, and the linear polarization layer 22 and the ¼ wavelength layer 21 may be sequentially on the passivation layer 18.

In this rear emission type AM-OLED, provided that the linear polarization layer 22 faces external light and the ¼ wavelength layer 21 faces the organic light-emitting element 3, the linear polarization layer 22 and the ¼ wavelength layer 21 may be on any surface of, e.g., the substrate 1, a TFT, the organic light-emitting element 3, etc. That is, similar to the configurations illustrated in FIGS. 1, 8, and 9, the ¼ wavelength layer 21 and/or the linear polarization layer 22 may be on a surface and/or the other surface of the substrate 1, and a TFT and the organic light-emitting element 3 may be on the ¼ wavelength layer 21 and/or the linear polarization layer 22. The ¼ wavelength layer 21 and/or the linear polarization layer 22 may also be interposed at an interface(s) between layers constituting a TFT.

Figure 20:
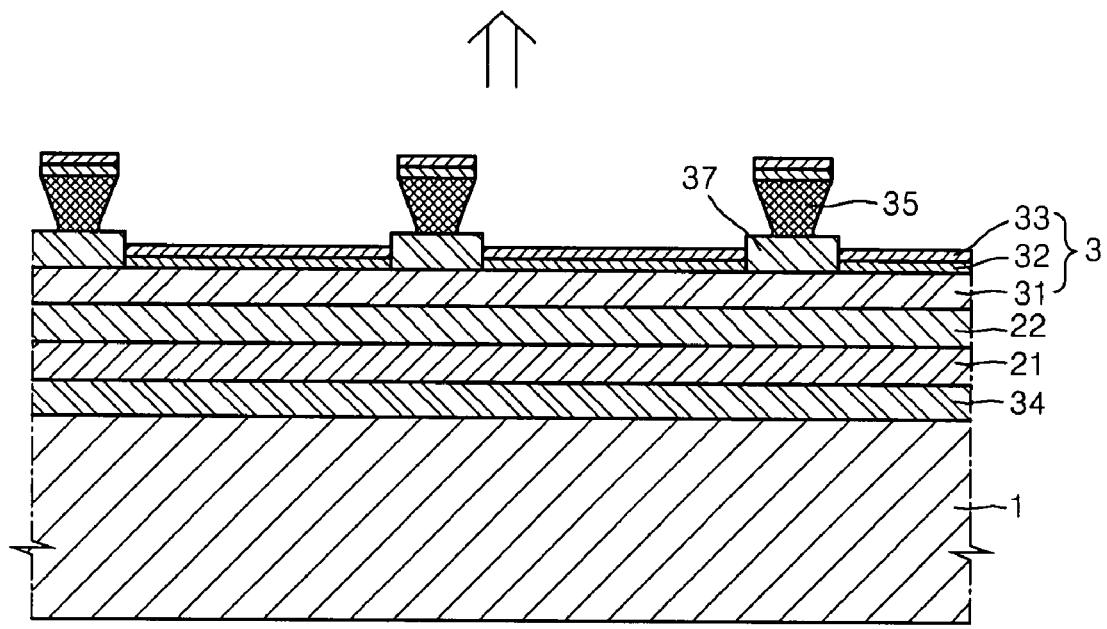
FIG. 20 illustrates a sectional view of a front emission type PM-OLED according to an embodiment of the present invention.

FIG. 20 illustrates a front emission type PM-OLED according to an embodiment of the present invention.

Referring to FIG. 20, and as similarly illustrated in FIG. 13, the reflective layer 34 may be on the substrate 1, the ¼ wavelength layer 21 and the linear polarization layer 22 may sequentially be on the reflective layer 34, and the organic light-emitting element 3 may be on the linear polarization layer 22.

The first electrode layer 31 may be formed in a stripe pattern on the linear polarization layer 22, and the internal insulating film 37 may be on the first electrode layer 31 to partition the first electrode layer 31. The separator 35 perpendicular to the first electrode layer 31 may be deposited on the internal insulating film 37 to pattern the emission layer 32 and the second electrode layer 33. The emission layer 32 and the second electrode layer 33 may be patterned by the separator 35 so that they intersect with the first electrode layer 31. A sealing member (not shown) may be on the second electrode layer 33 to protect the organic light-emitting element 3 from ambient air. In some cases, the emission layer 32 and the second electrode layer 33 may be patterned without using a separator.

According to the configuration illustrated in FIG. 20, as described above with reference to FIG. 13, incident light from outside may not be reflected, thereby improving contrast, and the entire thickness of a display device may be decreased.

Although not shown, the structures illustrated in FIGS. 10 through 12 and 14 through 16 may be applied to a front emission type PM-OLED as illustrated in FIG. 20.

Figure 21:
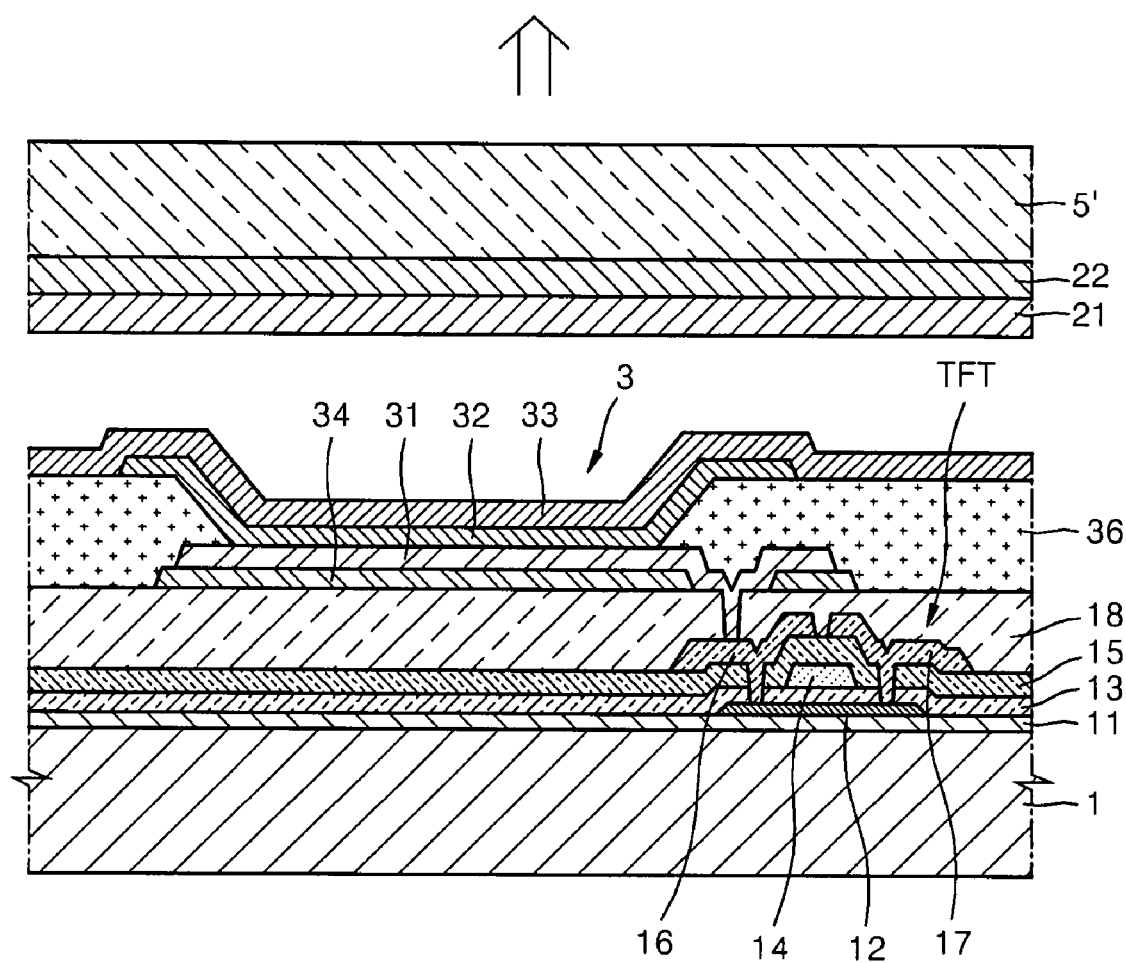
FIG. 21 illustrates a sectional view of a front emission type AM-OLED according to an embodiment of the present invention.

FIG. 21 illustrates a front emission type AM-OLED according to an embodiment of the present invention.

Referring to FIG. 21, a TFT may be on the substrate 1. Each pixel may include at least one TFT, and the TFT may be electrically connected to the organic light-emitting element 3. The structure of the TFT may be as described above with reference to FIG. 18, and a detailed description thereof will thus be omitted.

The TFT may be covered with a passivation layer 18, and the reflective layer 34 may be on the passivation layer 18. The first electrode layer 31, which may be used as an anode, may be on the reflective layer 34, and the first electrode layer 31 may be covered with the pixel define layer 36 made of an insulating material. The opening may be formed in the pixel define layer 36, and the emission layer 32 may be in a region defined by the opening. The second electrode layer 33 may be on the emission layer 32 to cover all the pixels.

In this embodiment of the present invention, the linear polarization layer 22 and the ¼ wavelength layer 21 may be sequentially disposed on a surface of a substrate material used as the thin film type sealing member 5' facing the organic light-emitting element 3, similar to the embodiment illustrated in FIG. 16. Therefore, the linear polarization layer 22 and the ¼ wavelength layer 21 may prevent the reflection of light incident on the top side of the thin film type sealing member 5 (as viewed in FIG. 21).

Although not shown, the structures illustrated in FIGS. 10 through 15 may also be applied to front emission type AM-OLEDs as illustrated in FIG. 21.

The above-described embodiments of the present invention are not limited to OLEDs, and may also be applied to, e.g., inorganic light-emitting devices, other flat panel displays such as LCDs, electron emission devices, etc.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:
    a substrate;
    an organic light-emitting element on the substrate;
    a sealing member on the organic light-emitting element;
    a ¼ wavelength layer on the substrate; and
    a linear polarization layer having a plurality of wire grids spaced apart from each other on the substrate, at least one of the ¼ wavelength layer and the linear polarization layer being positioned between the sealing member and the substrate, and the linear polarization layer being closer to an image display surface than the ¼ wavelength layer.

2. The organic light-emitting device as claimed in claim 1, wherein the image display surface is a surface of the substrate.

3. The organic light-emitting device as claimed in claim 2, wherein the linear polarization layer is on the substrate, the ¼ wavelength layer is on the linear polarization layer, and the organic light-emitting element is on the ¼ wavelength layer.

4. The organic light-emitting device as claimed in claim 2, wherein the ¼ wavelength layer is on a surface of the substrate, the organic light-emitting element is on the ¼ wavelength layer, and the linear polarization layer is on a surface of the substrate opposite to the ¼ wavelength layer.

5. The organic light-emitting device as claimed in claim 2, wherein at least one of the ¼ wavelength layer and the linear polarization layer is between the substrate and the organic light-emitting element.

6. The organic light-emitting device as claimed in claim 1, wherein the image display surface is a surface of the sealing member.

7. The organic light-emitting device as claimed in claim 6, wherein the ¼ wavelength layer is on the organic light-emitting element, and the linear polarization layer is on the ¼ wavelength layer.

8. The organic light-emitting device as claimed in claim 7, further comprising a protective layer on the linear polarization layer.

9. The organic light-emitting device as claimed in claim 6, further comprising a protective layer on the organic light-emitting element,
wherein the ¼ wavelength layer is on the protective layer and the linear polarization layer is on the ¼ wavelength layer.

10. The organic light-emitting device as claimed in claim 6, further comprising a protective layer on the organic light-emitting element,
wherein the ¼ wavelength layer is formed between the organic light-emitting element and the protective layer, and the linear polarization layer is on the protective layer.

11. The organic light-emitting device as claimed in claim 8, wherein the protective layer comprises at least one of an organic insulating material or an inorganic insulating material.

12. The organic light-emitting device as claimed in claim 6, further comprising a reflective layer interposed between the substrate and the organic light-emitting element,
wherein the ¼ wavelength layer is between the reflective layer and the organic light-emitting element, and the linear polarization layer is on the organic light-emitting element.

13. The organic light-emitting device as claimed in claim 6, wherein the sealing member is a transparent substrate, and the ¼ wavelength layer and the linear polarization layer are between the sealing member and the organic light-emitting element.

14. The organic light-emitting device as claimed in claim 6, wherein the sealing member is a transparent substrate, the ¼ wavelength layer is on a surface of the sealing member facing the organic light-emitting element, and the linear polarization layer is on an opposite surface of the sealing member to the ¼ wavelength layer.

15. The organic light-emitting device as claimed in claim 6, wherein the sealing member is a transparent substrate, the linear polarization layer is on a surface of the sealing member facing the organic light-emitting element, and the ¼ wavelength layer is on a surface of the linear polarization layer facing the organic light-emitting element.

16. The organic light-emitting device as claimed in claim 1, further comprising:
a thin film transistor on the substrate, the organic light-emitting element being electrically connected to the thin film transistor.

17. The organic light-emitting device as claimed in claim 16, wherein the image display surface is a surface of the substrate, and further comprises at least one of:
a) wherein the linear polarization layer is on the substrate, the ¼ wavelength layer is on the linear polarization layer, and the thin film transistor and the organic light-emitting element are on the ¼ wavelength layer;
b) wherein the linear polarization layer is on the thin film transistor, and the ¼ wavelength layer is on the linear polarization layer;
c) wherein the organic light-emitting device further comprises a protective layer covering the thin film transistor, and the linear polarization layer is on the protective layer, and the ¼ wavelength layer is on the linear polarization layer;
d) wherein the linear polarization layer is on the substrate, the thin film transistor is on the linear polarization layer, and the ¼ wavelength layer is on the thin film transistor;
e) wherein at least one of the linear polarization layer and the ¼ wavelength layer is interposed between layers constituting the thin film transistor;
f) wherein the linear polarization layer is on an opposite surface of the substrate to the thin film transistor, and the ¼ wavelength layer is on the thin film transistor;
g) wherein the ¼ wavelength layer is on a surface of the substrate, the thin film transistor is on the ¼ wavelength layer, and the linear polarization layer is on a surface of the substrate opposite to the ¼ wavelength layer; or
h) wherein the ¼ wavelength layer and the linear polarization layer are sequentially on a surface of the substrate opposite to the organic light-emitting element.

18. The organic light-emitting device as claimed in claim 16, wherein the image display surface is a surface of the sealing member, and further comprises at least one of:
a) wherein the ¼ wavelength layer is on the organic light-emitting element, and the linear polarization layer is on the ¼ wavelength layer;
b) wherein the organic light emitting device further comprises a protective layer on the linear polarization layer, the protective layer being formed from inorganic or organic insulating material;
c) wherein organic light emitting device further comprises a protective layer on the organic light-emitting element, the ¼ wavelength layer is on the protective layer, and the linear polarization layer is on the ¼ wavelength layer;
d) wherein organic light emitting device further comprises a protective layer on the organic light-emitting element, the ¼ wavelength layer is between the organic light-emitting element and the protective layer, and the linear polarization layer is on the protective layer;
e) wherein organic light emitting device further comprises a reflective layer interposed between the substrate and the organic light-emitting element, and the ¼ wavelength layer is between the reflective layer and the organic light-emitting element, and the linear polarization layer is on the organic light-emitting element;
f) wherein the sealing member is a transparent substrate, the ¼ wavelength layer is on a surface of the sealing member opposite to the organic light-emitting element, and the linear polarization layer is on the ¼ wavelength layer;
g) wherein the sealing member is a transparent substrate, the ¼ wavelength layer is on a surface of the sealing member facing the organic light-emitting element, and the linear polarization layer is on a opposite surface of the sealing member opposite to the ¼ wavelength layer; or
h) wherein the sealing member is a transparent substrate, the linear polarization layer is on a surface of the sealing member facing the organic light-emitting element, and the ¼ wavelength layer is on a surface of the linear polarization layer facing the organic light-emitting element.

19. The organic light-emitting device as claimed in claim 16, wherein the organic light emitting device is a front emission active matrix organic light-emitting device.

20. The organic light-emitting device as claimed in claim 1, wherein at least one of the ¼ wavelength layer and the linear polarization layer is between the organic light emitting element and the substrate.

* * * * *